(12) United States Patent
Winkel et al.

(10) Patent No.: US 6,803,652 B2
(45) Date of Patent: Oct. 12, 2004

(54) HEAT DISSIPATION DEVICE HAVING A LOAD CENTERING MECHANISM

(75) Inventors: Casey R. Winkel, Olympia, WA (US); Michael Z. Eckblad, Auburn, WA (US); Jeffrey J. Sopko, Aloha, OR (US)

(73) Assignee: Intel Corporation, Santa Clara, CA (US)

(*) Notice: Subject to any disclaimer, the term of this patent is extended or adjusted under 35 U.S.C. 154(b) by 270 days.

(21) Appl. No.: 09/870,952

(22) Filed: May 30, 2001

(65) Prior Publication Data

US 2002/0180034 A1 Dec. 5, 2002

(51) Int. Cl.[7] ............................................. H01L 29/72
(52) U.S. Cl. ....................... 257/706; 257/715; 257/719; 257/721; 438/117
(58) Field of Search ................................ 257/706, 715, 257/719, 721; 438/117

(56) References Cited

U.S. PATENT DOCUMENTS

| | | | |
|---|---|---|---|
| 5,386,338 A | * | 1/1995 | Jordan et al. ............... 257/718 |
| 5,428,897 A | | 7/1995 | Jordan et al. |
| 5,615,735 A | | 4/1997 | Yoshida et al. |
| 5,932,925 A | * | 8/1999 | McIntyre ..................... 257/719 |
| 6,219,241 B1 | * | 4/2001 | Jones .......................... 257/718 |
| 6,229,703 B1 | | 5/2001 | Lee |

FOREIGN PATENT DOCUMENTS

| | | |
|---|---|---|
| GB | 2 281 149 A | 2/1995 |
| JP | 2000 022370 A | 1/2000 |

\* cited by examiner

*Primary Examiner*—Edward Wojciechowicz
(74) *Attorney, Agent, or Firm*—Rob G. Winkle

(57) ABSTRACT

A heat dissipation device having an integral load centering mechanism adapted to provide a location for contact between a spring clip and the heat dissipation device. The load centering mechanism is located in an area on the heat dissipation device which will provide a centered loading to a microelectronic die and constitutes substantially the only place where the spring clip contacts the heat dissipation device when the spring clip is providing a force against the heat dissipation device.

29 Claims, 10 Drawing Sheets

HEAT DISSIPATION DEVICE HAVING A LOAD CENTERING MECHANISM

BACKGROUND OF THE INVENTION

1. Field of the Invention

The present invention relates to apparatus for removing heat from electronic devices. In particular, the present invention relates to a heat sink having a load centering mechanism.

2. State of the Art

Higher performance, lower cost, increased miniaturization of integrated circuit components, and greater packaging density of integrated circuits are ongoing goals of the microelectronic and computer industry. As these goals are achieved, microelectronic dice become smaller. Accordingly, the density of power consumption of the integrated circuit components in the microelectronic die has increased, which, in turn, increases the average junction temperature of the microelectronic die. If the temperature of the microelectronic die becomes too high, the integrated circuits of the microelectronic die may be damaged or destroyed.

Various apparatus and techniques have been used and are presently being used for removing heat from microelectronic dice. One such heat dissipation technique involves the attachment of a heat dissipation device to a microelectronic die. One known embodiment, as shown in FIG. 3a, comprises a pin grid array-type ("PGA") microelectronic die 202 placed in a socket 204 mounted on a carrier substrate 206, wherein pins 208 extending from the microelectronic die 202 make electrical contact with conductive vias 212 in the socket 204. The socket 204 is, in turn, in electrical contact (not shown) with the carrier substrate 206. The heat dissipation device 220 (shown as a finned heat sink having a plurality of fins 222) is kept in contact with the microelectronic die 202 with a spring clip 224 (see also FIG. 3b), which spans the heat dissipation device 220 and connects to the socket 204. Conductive grease or other such thermal interface 226 is placed between the microelectronic die 202 and the heat dissipation device 220. The disadvantage of this assembly is that the spring clip 224 distributes a disproportionate, lateral force or loading across the microelectronic die 202, which may cause cracking of the microelectronic die 202.

In order to prevent disproportionate loading, two load centering techniques have been developed. FIGS. 4a and 4b illustrate one technique for load centering comprising a secondary clip 240 attached to or snapped on a spring clip 234. The force imposed on the heat dissipation device 208 by the spring wire 234 is directed through the secondary clip 240. Thus, the secondary clip 240 can be positioned at any desired location on the spring clip 234 to provide loading in that position. The disadvantage with using a secondary clip 240 for load centering is that it requires additional processing steps to correctly place the secondary clip 240.

FIG. 5 illustrates a second technique for load centering comprising a spring clip 242 having an altered portion 244. The altered portion 244 may comprise a bend or a series of bends in the spring clip 242. Thus, when the spring clip 242 is attached, the force imposed on the heat dissipation device 208 by the spring clip 242 is directed through the altered portion 244. Thus, the altered portion 244 may be positioned at any desired location on the spring clip 242 to provide loading in that position. The disadvantage with using the spring clip 242 is that forming the altered portion 244 tends to reduce the retention force of the spring chip 242.

Therefore, it would be advantageous to develop a heat dissipation device having a load centering mechanism, which overcomes the disadvantages of known load centering mechanisms.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE ILLUSTRATED EMBODIMENT

Figure 1A:
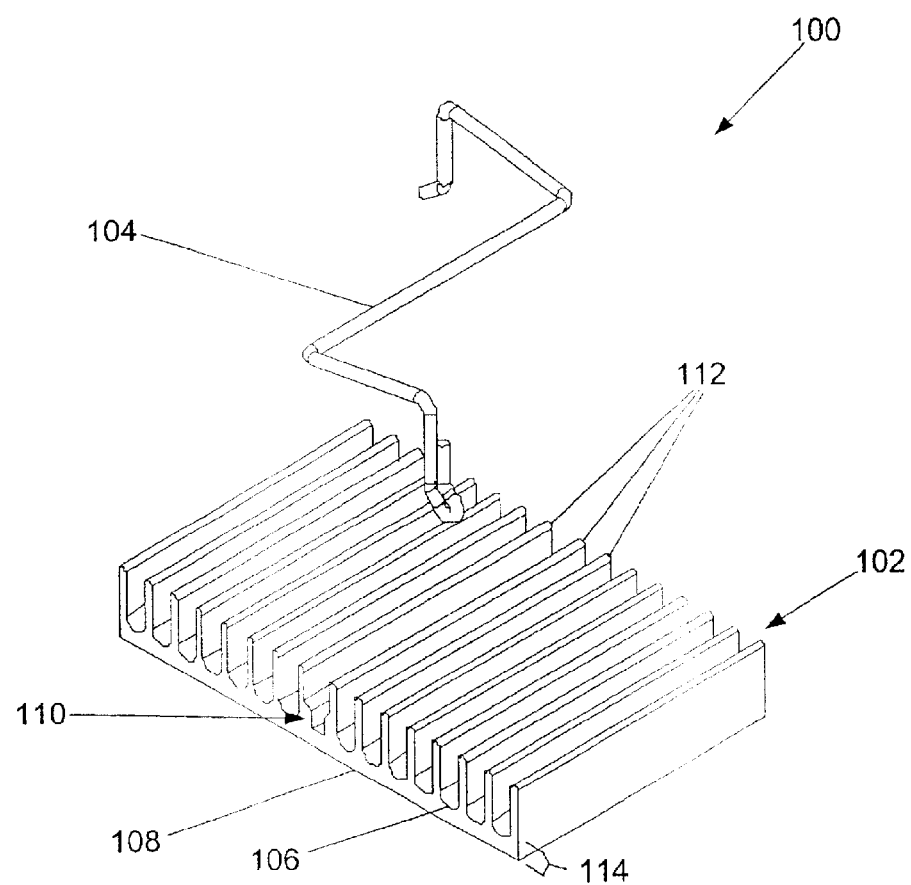
FIGS. 1a–1h are various views of an embodiment of a heat dissipation device having a load centering mechanism, according to the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implement within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

The present invention includes a heat dissipation device having an integral load centering mechanism adapted to provide a location for contact between a spring clip and the heat dissipation device. The load centering mechanism is located in an area on the heat dissipation device which will provide a centered loading to a microelectronic die and constitutes substantially the only place where the spring clip contacts the heat dissipation device when the spring clip is providing a force against the heat dissipation device.

FIG. 1a illustrates a first embodiment of a heat dissipation assembly 100, according to the present invention. The heat dissipation assembly 100 includes a heat dissipation device 102 and a spring clip 104. The heat dissipation device 102 comprises a base 114 having a first base surface 106 and an opposing second base surface 108. A plurality of fins 112 extends substantially perpendicularly from the first base surface 106. The spring clip 104 fits into a spring clip channel 110, as will be subsequently discussed. The spring clip channel 110 may simply be the space defined between two selected fins 112.

Figure 1B:
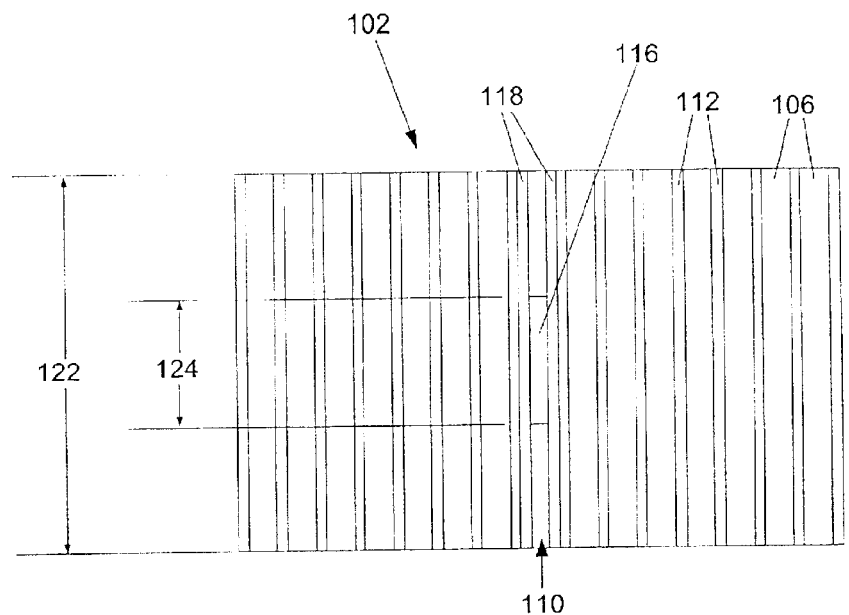
Figure 1C:
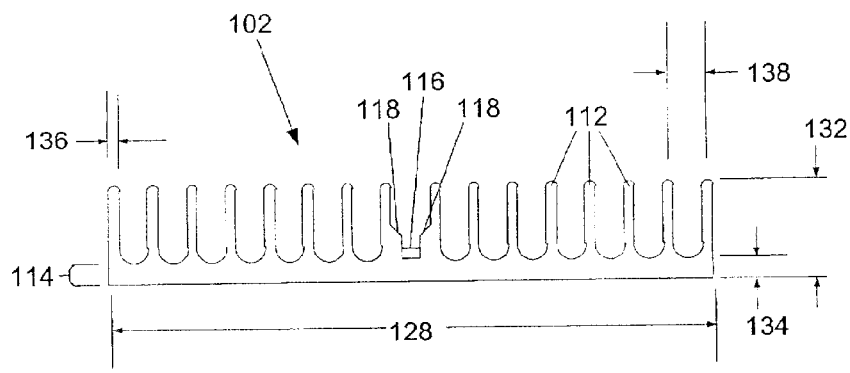

FIGS. 1b and 1c illustrate a top plan view and a side plan view, respectively, of the heat dissipation device 102 of FIG. 1a. The heat dissipation device 102 includes a load centering mechanism 116. The load centering mechanism 116 comprises a projection/platform/pedestal extending from the first base surface 106 within the spring clip channel 110. The spring clip channel 110 may also include at least one sloped side 118 to assist in orienting the spring clip 104 (not shown) on the load centering mechanism 116.

In one embodiment, the heat dissipation device 102 may have a length 128 of about 4.66 inches, a width 122 of about 2.92 inches, and an overall height 132 (including fins 112) of about 0.76 inches. The load centering mechanism 116 is shown substantially centered along the heat dissipation device length 128 and width 122 and has a length of about 1.00 inches. The fins 112 have a thickness 136 of about 0.08 inches and a center-to-center distance 138 of about 0.30 inches. The base 114 has a thickness 134 of about 0.16 inches. The load center device 116 may have a height (not shown) of about 0.16 inches and a width (not shown) of about 0.28 inches. It is, of course, understood that the dimension given are merely exemplary and that a variety of dimensions could be used depending on various design parameters, as will be understood by those skilled in the art.

Figure 1D:
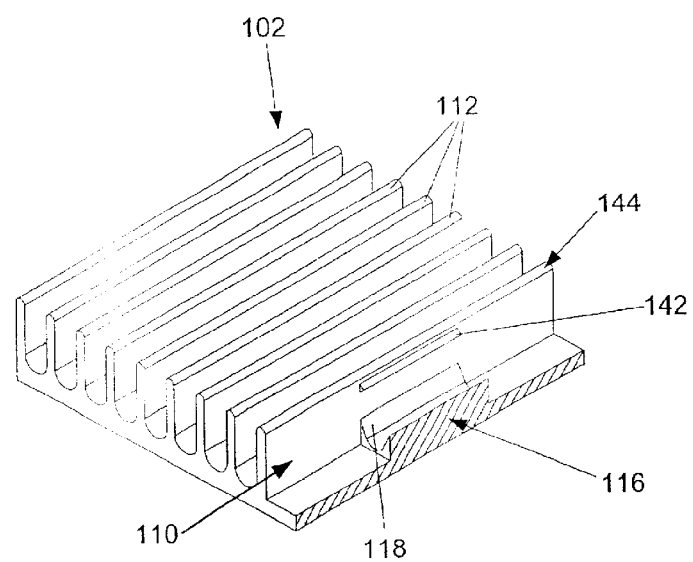
Figure 1E:
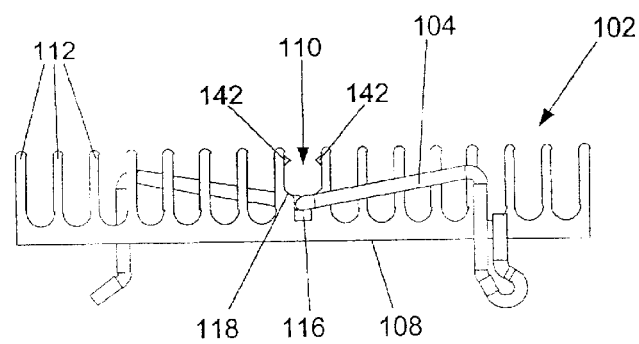

FIG. 1d illustrates a cross-sectional view of the heat dissipation device 102 along the spring clip channel 110. As shown, the sides 118 may be limited to residing on the load centering mechanism 116, rather than extending the length of the spring clip channel 110 as shown in FIGS. 1b and 1c. The spring clip channel 110 may further include at least one lip 142 proximate a distal end 144 of at least one fin 112 that defines the spring clip channel 110. The lip(s) 142 assists in retaining the spring clip 104 within the spring clip channel 110, as shown in FIG. 1e.

The load centering mechanism 116 may be formed by any technique known in the art. For example, if the heat dissipation device 102 is formed by molding, the load centering mechanism 116 may be directly molded with the heat dissipation device 102. If the heat dissipation device 102 is formed by extrusion, the load centering mechanism 116 may be milled from a portion of the extruded heat dissipation device 102 within the spring clip channel 110 (preferred). Additionally, the load centering mechanism 116 may be attached to the heat dissipation device 102 after the fabrication thereof.

Figure 1F:
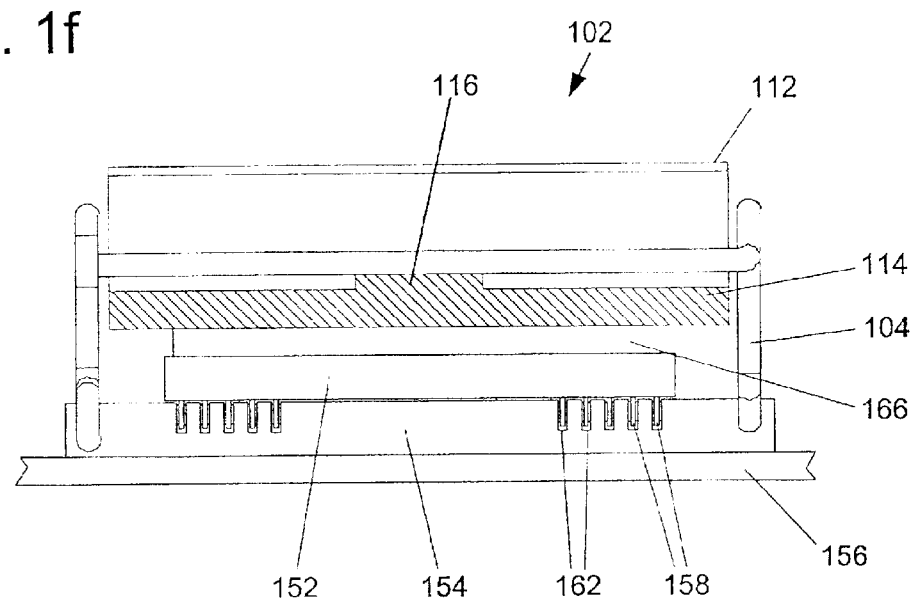

FIG. 1f illustrates the heat dissipation device 102 in thermal contact with a pin grid array-type ("PGA") microelectronic die 152, which resides in a socket 154 mounted on the carrier substrate 156. Pins 158 extend from the PGA microelectronic die 152 make electrical contact with conductive vias 162 in the socket 154. The socket 154 is, in turn, in electrical contact (not shown) with the carrier substrate 156. The heat dissipation device 102 is kept in contact with the microelectronic die 152 with the spring clip 104, which spans the heat dissipation device 102 contacting the load centering mechanism 116 and connects to the socket 154. Conductive grease or other such thermal interface 166 is placed between the microelectronic die 152 and the heat dissipation device 102. It is, of course, understood that this illustrated example is merely one of many possible variants, which will be evident to those skilled in the art. For example, the spring clip 104 could extend to and be secured to the carrier substrate 156, rather than the socket 154.

Figure 1G:
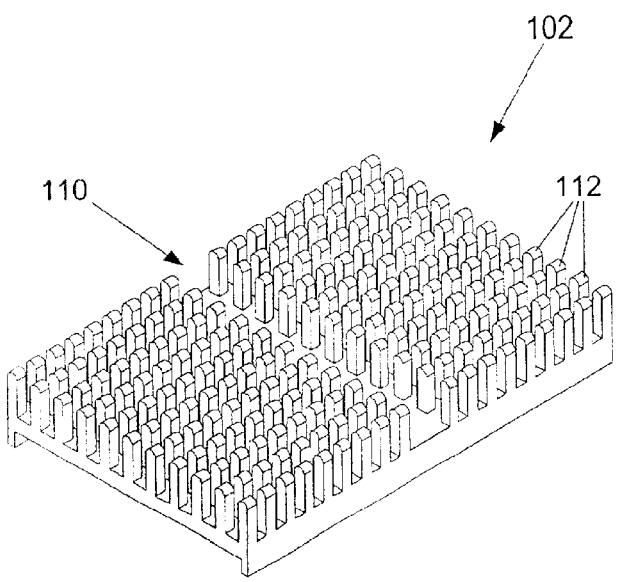
Figure 1H:
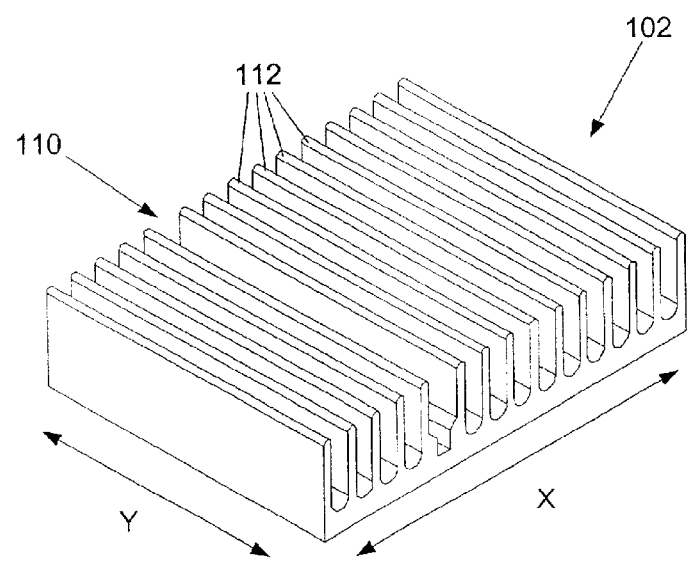

It is, of course, understood that the fins 112 are not limited to elongated plates, as shown in FIGS. 1a–1f, but may any applicable geometric shape, including but not limited to, columns or pillars, as shown in FIG. 1g. Further, it is also understood that the load centering mechanism 116 may be placed in any positioned desired on heat dissipation device 102 along an X-axis and a Y-axis. For example, as illustrated in FIG. 1h, the spring clip channel 110 is shifted along the X-axis.

Figure 2A:
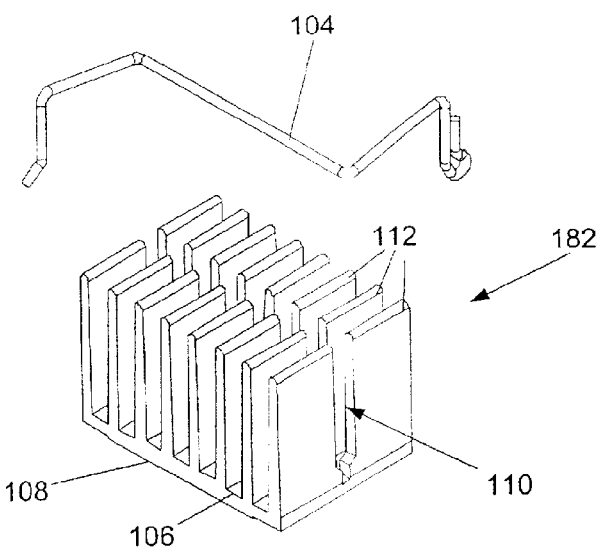
FIGS. 2a–2c are various views of another embodiment of a heat dissipation device having a load centering mechanism, according to the present invention.
Figure 2B:
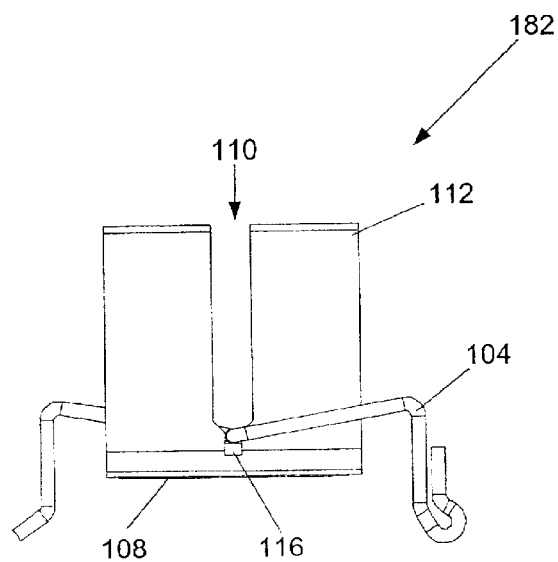
Figure 2C:
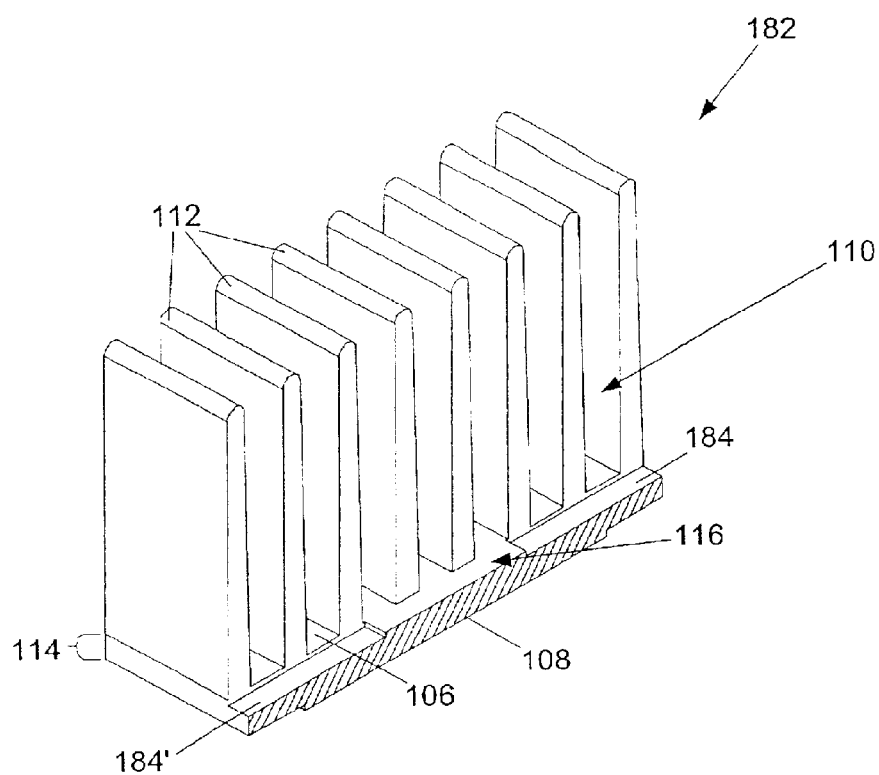
Figure 3A:
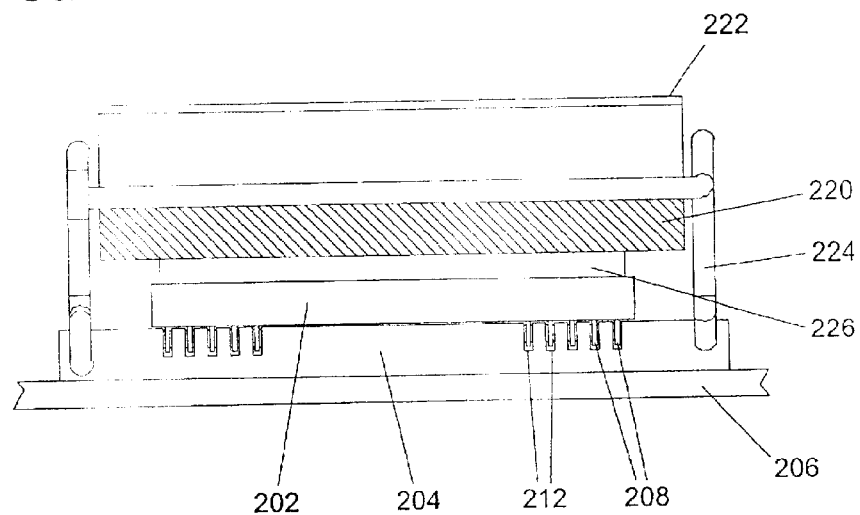
FIGS. 3a and 3b are views of a heat dissipation device attached to a microelectronic die, as known in the art.
Figure 3B:
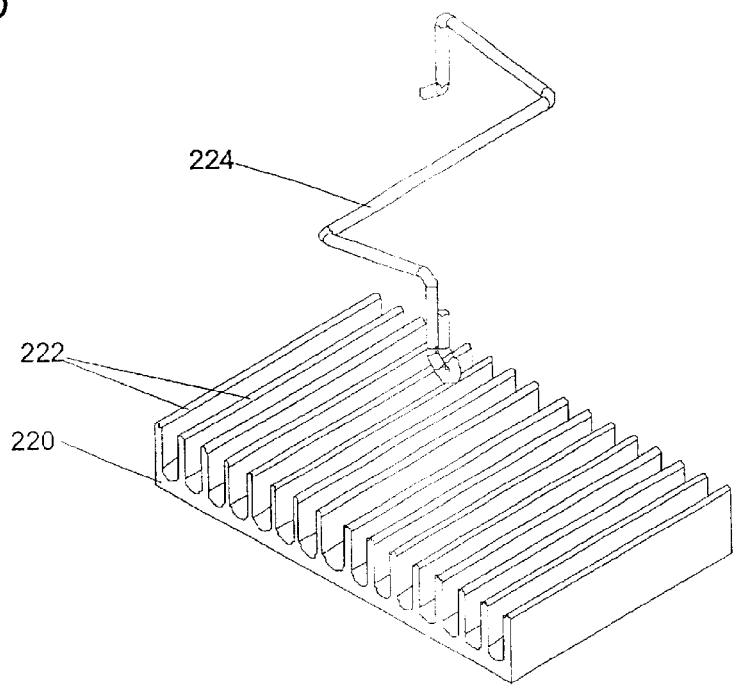
Figure 4A:
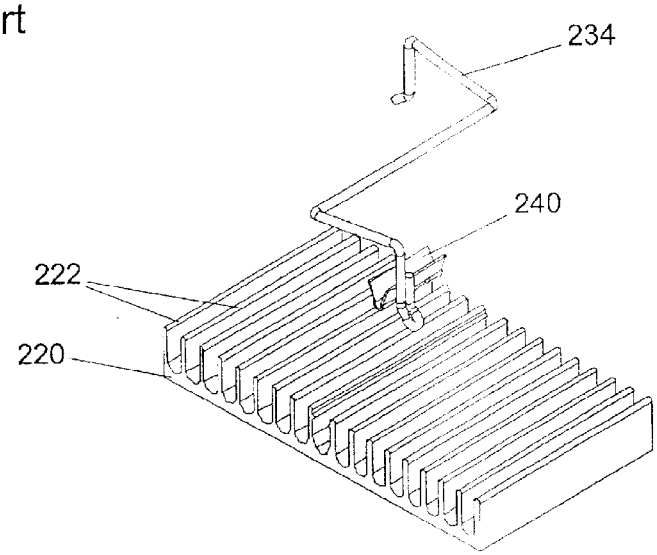
FIGS. 4a and 4b are views of a heat dissipation device having a load centering secondary clip, as known in the art.
Figure 4B:
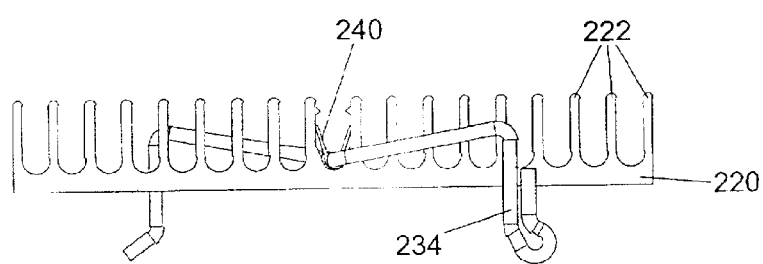
Figure 5:
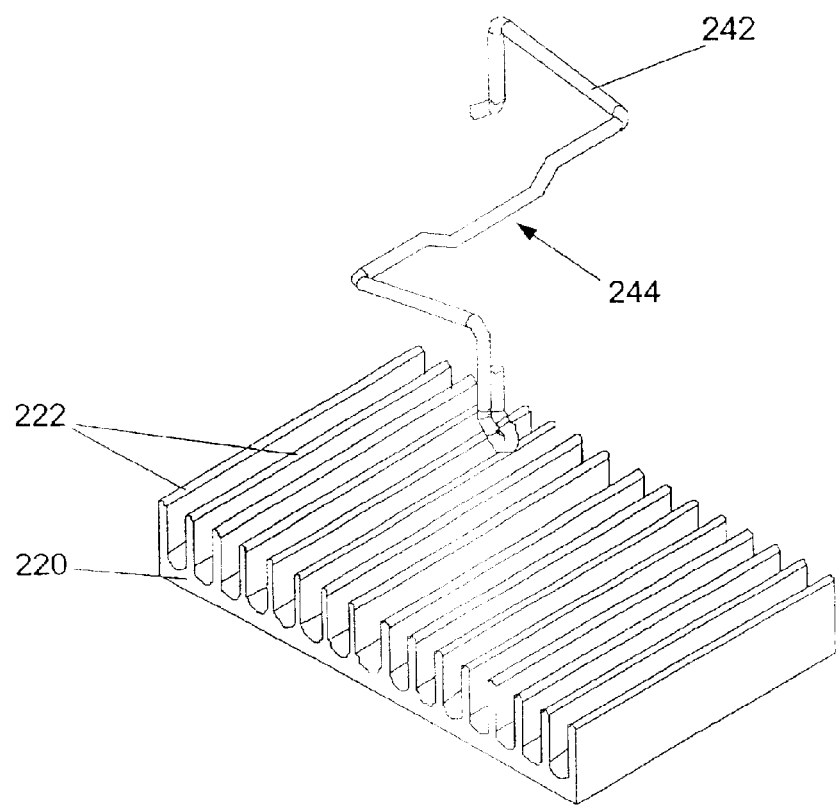
FIG. 5 is a view of a heat dissipation device having a modified spring clip for load centering, as known in the art.

FIGS. 2a–2c illustrate another embodiment of a heat dissipation device 182 of the present invention. The spring clip channel 110 is transverse to the fins 112 rather than running in parallel, as shown in FIGS. 1a–1d. As shown in FIG. 2c (a cross-sectional view of the spring clip channel 110), the load centering mechanism 116 may be formed by milling at least one depression 184, 184' into the base 114 from the first base surface 106 proximate the load centering mechanism 116, rather than forming the load centering mechanism 116 to extend from the first base surface 106.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A heat dissipation device, comprising:
    a base having a first base surface;
    at least one fin extending from said first base surface;
    a spring clip channel defined proximate said at least one fin; and
    a load centering mechanism within said spring clip channel, said load centering mechanism integrally associated with said first base surface, wherein said load centering mechanism comprises a pedestal extending from said first base surface.

2. The heat dissipation device of claim 1, wherein said spring clip channel further includes at least one sloped side adapted to orient a spring clip on said load centering mechanism.

3. A heat dissipation device, comprising:
    a base having a first base surface;
    at least one fin extending from said first base surface;
    a spring clip channel defined proximate said at least one fin; and
    a load centering mechanism within said spring clip channel, said load centering mechanism integrally associated with said first base surface, wherein said load centering mechanism includes at least one sloped side adapted to orient a spring clip thereon.

4. The heat dissipation device of claim 1, further including at least one depression defined in said base from said first base surface that defines said load centering mechanism.

5. A microelectronic assembly, comprising:
    a microelectronic device; and
    a heat dissipation device, including a base having a first base surface and an opposing second surface, wherein said heat dissipation device makes thermal contact with said microelectronic device, and including at least one fin extending from said first base surface, a spring clip channel defined proximate said at least one fin, and a load centering mechanism within said spring clip channel, said load centering mechanism integrally associated with said first base surface, wherein said load centering mechanism of said heat comprises a pedestal extending from said first base surface.

6. The microelectronic assembly of claim 5, wherein said spring clip channel further includes at least one sloped side adapted to orient a spring clip on said load centering mechanism.

7. A microelectronic assembly, comprising:
a microelectronic device; and
a heat dissipation device, including a base having a first base surface and an opposing second surface, wherein said heat dissipation device makes thermal contact with said microelectronic device, and including at least one fin extending from said first base surface, a spring clip channel defined proximate said at least one fin, and a load centering mechanism within said spring clip channel, said load centering mechanism integrally associated with said first base surface, wherein said load centering mechanism includes at least one sloped side adapted to orient a spring clip thereon.

8. The microelectronic assembly of claim 5, further including at least one depression defined in said base from said first base surface that defines said load centering mechanism.

9. A method for fabricating a heat dissipation device, comprising:
forming a base having a first base surface;
forming at least one fin extending from said first base surface;
forming a spring clip channel defined proximate said at least one fin;
forming a load centering mechanism within said spring clip channel, said load centering mechanism integrally associated with said first base surface; and
wherein said forming said base, forming said at least one fin, forming said spring clip channel, and forming said load centering mechanism occur substantially simultaneously in a molding process.

10. A method of fabricating a heat dissipation device, comprising:
forming a base having a first base surface;
forming at least one fin extending from said first base surface;
forming a spring clip channel defined proximate said at least one fin; and
forming a load centering mechanism within said spring clip channel, said load centering mechanism integrally associated with said first base surface, and, wherein forming said load centering mechanism comprises forming a pedestal extending from said first base surface.

11. The method of claim 9, wherein forming said load centering mechanism comprises attaching said load centering mechanism to said base first surface within said spring clip channel.

12. The method of claim 9, wherein forming said base, forming said at least one fin, and forming said spring clip channel occur substantially simultaneously in a extrusion process, and forming said load centering mechanism comprises milling away a portion of said spring clip channel.

13. The method of claim 9, wherein forming said load centering mechanism comprises forming at least one depression extending into said base from said base first surface within said spring clip channel.

14. The method of claim 9, wherein forming said spring clip channel further includes forming at least one sloped side adapted to orient a spring clip on said load centering mechanism.

15. A method for fabricating a heat dissipation device, comprising:
forming a base having a first base surface;
forming at least one fin extending from said first base surface;
forming a spring clip channel defined proximate said at least one fin;
forming a load centering mechanism within said spring clip channel, said load centering mechanism integrally associated with said first base surface; and wherein forming said load centering mechanism further includes forming at least one sloped side adapted to orient a spring clip thereon.

16. The heat dissipation device of claim 3, wherein said spring clip channel further includes at least one sloped side adapted to orient a spring clip on said load centering mechanism.

17. The heat dissipation device of claim 3, further including at least one depression defined in said base from said first base surface that defines said load centering mechanism.

18. The microelectronic assembly of claim 7, wherein said spring clip channel further includes one sloped side adapted to oriented a spring clip on said load centering mechanism.

19. The microelectronic assembly of claim 7, further including at least one depression defined in said base from said base surface that defines said load centering mechanism.

20. The method of claim 10, wherein forming said load centering mechanism comprises attaching said load centering mechanism to said base first surface within said spring clip channel.

21. The method of claim 10, wherein forming said base, forming said at least one fin, and forming said spring clip channel occur substantially simultaneously in a extrusion process, and forming said load centering mechanism comprises milling away a portion of said spring clip channel.

22. The method of claim 10, wherein forming said load centering mechanism comprises forming at least one depression extending into said base from said base first surface within said spring clip channel.

23. The method of claim 10, wherein forming said spring clip channel further includes forming at least one sloped side adapted to orient a spring clip on said centering mechanism.

24. The method of claim 10, wherein forming said load centering mechanism further includes forming at least one sloped side adapted to orient a spring clip thereon.

25. The method of claim 15, wherein forming said load centering mechanism comprises attaching said load centering mechanism to said base first surface within said spring clip channel.

26. The method of claim 15, wherein forming said base, forming said at least one fin, and forming said spring clip channel occur substantially simultaneously in a extrusion process, and forming said load centering mechanism comprises milling away a portion of said spring clip channel.

27. The method of claim 15, wherein forming said load centering mechanism comprises forming at least one depression extending into said base from said base first surface within said spring clip channel.

28. The method of claim 15, wherein forming said spring clip channel further includes forming at least one sloped side adapted to orient a spring clip on said load centering mechanism.

29. The method of claim 15, wherein forming said load centering mechanism further includes forming at least one sloped side adapted to orient a spring clip thereon.

* * * * *

UNITED STATES PATENT AND TRADEMARK OFFICE
CERTIFICATE OF CORRECTION

PATENT NO. : 6,803,652 B2
DATED : October 12, 2004
INVENTOR(S) : Winkel et al.

It is certified that error appears in the above-identified patent and that said Letters Patent is hereby corrected as shown below:

Column 6,
Line 23, delete "oriented" and insert -- orient --.

Signed and Sealed this

Thirty-first Day of May, 2005

JON W. DUDAS
*Director of the United States Patent and Trademark Office*